United States Patent
Ehrne et al.

(10) Patent No.: US 10,770,326 B2
(45) Date of Patent: Sep. 8, 2020

(54) POSITIONING DEVICE, LOADING AND/OR UNLOADING SYSTEM AND METHOD FOR OPERATING A POSITIONING DEVICE

(71) Applicant: VAT Holding AG, Haag (CH)

(72) Inventors: Florian Ehrne, Fruemsen (CH); Martin Netzer, Bludenz (AT); Andreas Hofer, Widnau (CH); Marco Apolloni, Marbach (CH)

(73) Assignee: VAT Holding AG, Haag (CH)

( * ) Notice: Subject to any disclaimer, the term of this patent is extended or adjusted under 35 U.S.C. 154(b) by 0 days.

(21) Appl. No.: 16/377,782

(22) Filed: Apr. 8, 2019

(65) Prior Publication Data

US 2019/0311932 A1    Oct. 10, 2019

(30) Foreign Application Priority Data

Apr. 10, 2018    (EP) .................................... 18166681

(51) Int. Cl.
*H01L 21/677* (2006.01)
*H01L 21/68* (2006.01)
*H01L 21/67* (2006.01)

(52) U.S. Cl.
CPC ........ *H01L 21/681* (2013.01); *H01L 21/6773* (2013.01); *H01L 21/67259* (2013.01); *H01L 21/67709* (2013.01); *H01L 21/67733* (2013.01); *H01L 21/67775* (2013.01); *H01L 21/67778* (2013.01); *H01L 21/67781* (2013.01)

(58) Field of Classification Search
CPC ................................................ H01L 21/67733
See application file for complete search history.

(56) References Cited

U.S. PATENT DOCUMENTS

| | | | |
|---|---|---|---|
| 2008/0063496 A1 | 3/2008 | Bufano et al. | |
| 2008/0080963 A1* | 4/2008 | Bufano | H01L 21/67017 414/788 |
| 2015/0170948 A1 | 6/2015 | Hara et al. | |
| 2016/0276191 A1* | 9/2016 | Kinugawa | H01L 21/67259 |

FOREIGN PATENT DOCUMENTS

| | | |
|---|---|---|
| DE | 103 48 015 A1 | 5/2005 |
| DE | 10348015 A1 * | 5/2005 |
| DE | 10 2013 011 873 A1 | 1/2015 |
| JP | S59-61921 A | 4/1984 |
| JP | 2010-258107 A | 11/2010 |

OTHER PUBLICATIONS

Extended European Search Report dated Sep. 25, 2018 issued in corresponding European patent application No. 18166681.9 (and partial English translation).

* cited by examiner

*Primary Examiner* — Gerald McClain
(74) *Attorney, Agent, or Firm* — Posz Law Group, PLC

(57) ABSTRACT

A positioning device, in particular a wafer transportation container positioning device, for positioning a wafer transportation container in a loading and/or unloading position of a loading and/or unloading station which is configured at least for loading and/or unloading wafers from the wafer transportation container.
The positioning device, in particular the wafer transportation container positioning device, comprises a positioning mechanism which is configured for contactless positioning of the wafer transportation container in a coupling process between the wafer transportation container and the loading and/or unloading station.

8 Claims, 5 Drawing Sheets

Figure 1:
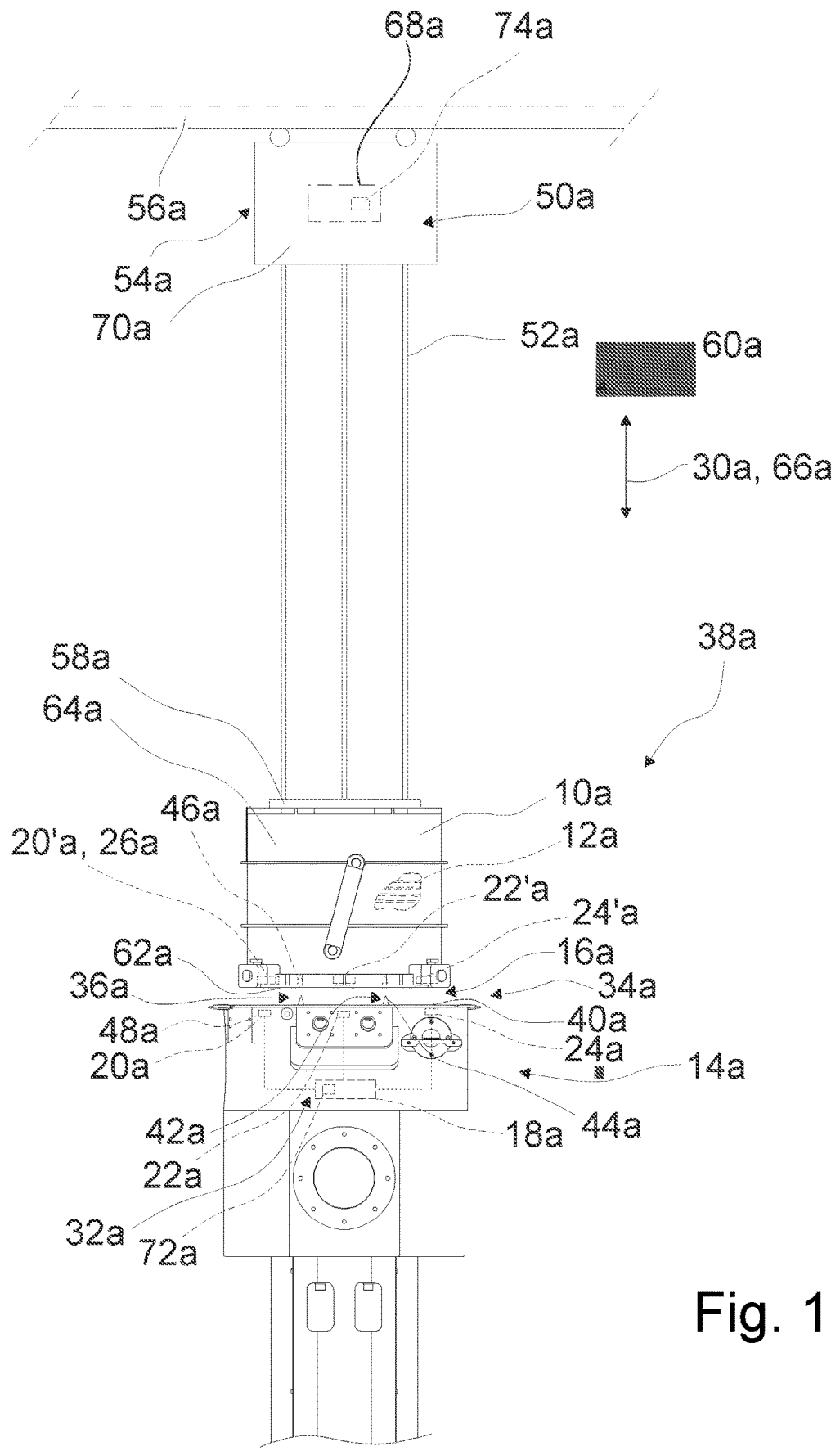

POSITIONING DEVICE, LOADING AND/OR UNLOADING SYSTEM AND METHOD FOR OPERATING A POSITIONING DEVICE

CROSS REFERENCE TO RELATED APPLICATION

This application is based on and incorporates herein by reference European Patent Application No. 18166681.9 filed on Apr. 10, 2018.

PRIOR ART

The invention relates to a positioning device, in particular a wafer transportation container positioning device, according to the preamble of Claim 1, to a loading and/or unloading system according to Claim 19 and to a method for operating a positioning device according to the preamble of Claim 20.

A positioning device for positioning a wafer transportation container in a loading and/or unloading position of a loading and/or unloading station which is configured at least for loading and/or unloading wafers from the wafer transportation container has already been proposed.

The object of the invention consists, in particular, in providing a generic device with advantageous characteristics with regard to positioning a wafer transportation container on a loading and/or unloading station for wafers from the wafer transportation container. The object is achieved according to the invention by the features of Claims 1, 19 and 20, whilst advantageous designs and further developments of the invention can be found in the subclaims.

ADVANTAGES OF THE INVENTION

The invention proceeds from a positioning device, in particular a wafer transportation container positioning device, for positioning a wafer transportation container in a loading and/or unloading position of a loading and/or unloading station which is configured at least for loading and/or unloading wafers from the wafer transportation container.

It is proposed that the positioning device, in particular the wafer transportation container positioning device, comprises a positioning mechanism which is configured for contactless positioning of the wafer transportation container in a coupling process between the wafer transportation container and the loading and/or unloading station. As a result, it is possible to achieve advantageous characteristics with regard to positioning a wafer transportation container on a loading and/or unloading station for wafers from the wafer transportation container. In particular, it is possible advantageously to reduce and/or avoid particle generation in a coupling process by means of the positioning mechanism, in particular by external friction, in particular resulting in particle generation, between fixed bodies, in particular between the wafer transportation container and the loading and/or unloading station, being able to be avoided. Particle avoidance is advantageous in particular under clean room conditions under which, in particular, wafer production and/or wafer processing in a wafer fabrication plant typically takes place as even the smallest particles of wafer can cause damage. In addition, particles can impair regular functioning of vacuum seals and can result, in particular, in a reduction in the tightness of the vacuum seals, for example by settling between vacuum seal elements. A corresponding reduction in the number of particles by avoiding particle generation in a surrounding area of the vacuum seals can accordingly advantageously enable a high level of tightness of the vacuum seals, in particular also where the vacuum seals are frequently opened and/or closed. In addition, by means of avoiding surface contact as a result of contactless positioning, material wear is able to be reduced, as a result of which it is possible, advantageously, to achieve a long operating life, in particular with a high level of positioning precision sustained over the operating life. Contacting guide elements of a contacting positioning mechanism may wear down, for example, over time, as a result of which any play during positioning can increase. Such an effect can be advantageously avoided by means of contactless positioning. In addition, particularly uniform and/or jerk-free positioning can be made possible in an advantageous manner by means of the contactless positioning mechanism, in particular in contrast to contacting positioning where, for example, as a result of static friction and/or as a result of irregularities in at least one of the contacting surfaces, acceleration can be jerky, which can result in the wafers supported in the wafer transportation container slipping. As a result, damage to wafers caused by slipping is able to be advantageously avoided.

A "positioning device", in particular a "wafer transportation container positioning device", is configured, in particular, for the purpose of influencing and preferably of steering and/or controlling an, in particular at least two-dimensional, preferably three-dimensional, movement of a wafer transportation container, in particular in a coupling process, in such a manner that the wafer transportation container assumes a provided spatial alignment when approaching a loading and/or unloading position and/or when depositing in the loading and/or unloading position. The positioning device, in particular the wafer transportation container positioning device, can be configured, in particular, for the purpose of performing at least one pre-positioning of the wafer transportation container when the wafer transportation container approaches a loading and/or unloading station such that a deviation of an alignment of the wafer transportation container from an ideal alignment relative to the loading and/or unloading position and/or from an ideal positioning of the wafer transportation container in the loading and/or unloading position is as small as possible. The wording a "deviation is as small as possible" is to be understood, in particular, as the wafer transportation container being rotated by no more than 2°, preferably by no more than 1°, advantageously by no more than 0.6°, in a preferred manner by no more than 0.3° and particularly preferred by no more than 0.1° relative to an ideal loading and/or unloading position and/or as the wafer transportation container being offset by no more than 3 mm, preferably by no more than 2 mm, advantageously by no more than 1 mm, particularly advantageously by no more than 0.6 mm, in a preferred manner by no more than 0.3 mm and in a particularly preferred manner by no more than 0.1 mm relative to the ideal loading and/or unloading position in an arbitrary direction. "Positioning" is to be understood, in particular, as rotational and/or translatory positioning relative to the ideal loading and/or unloading position. In the case of ideal alignment and/or ideal positioning, contact regions of the wafer transportation container and of the loading and/or unloading station configured for coupling overlap completely. The positioning is preferably realized as pre-positioning which takes place, in particular, after rough positioning, the rough positioning being accomplished, for example, by means of delivery by a wafer transportation container transport system of a wafer fabrication plant. In addition, positioning, in particular pre-positioning, takes place prior to final positioning. Final positioning can be accomplished, for example, by means of positioning and/or guiding pins, the positioning and/or guiding pins preferably being configured for producing a positive locking closure between the wafer transportation container and the loading and/or unloading station in the loading and/or unloading position. The wafer transportation container is situated in the ideal loading and/or unloading position in particular following final positioning. The term "configured" is to be understood, in particular, as specially programmed, designed and/or equipped. An object being configured for a specific function is to be understood, in particular as the object fulfilling and/or carrying out said specific function in at least one application and/or operating state.

A "wafer transportation container" is to be understood, in particular, as a transportation container with a closable interior, the interior being configured for receiving wafers. The wafer transportation container is configured, in particular, at least for transportation of wafers with a diameter of at least 200 mm, preferably of at least 300 mm and in a preferred manner of at least 450 mm. The wafer transportation container is configured, in particular, at least for transportation of at least one wafer, preferably at least three wafers, advantageously at least five wafers, particularly advantageously at least ten wafers, in a preferred manner at least 25 wafers and in a particularly preferred manner no more than a hundred wafers. As an alternative to this or in addition to it, the wafer transportation container is configured for receiving at least one object which has been realized differently to a wafer, for example an exposure mask. The wafer transportation container is realized, in particular, so as to be portable. The wafer transportation container is realized, in particular, so as to be closable in a vacuum-tight manner.

The wafer transportation container is preferably realized as a vacuum wafer transportation container which is configured, in particular, for the purpose of providing and/or maintaining a vacuum atmosphere in its interior. The wafer transportation container is configured, in particular, for storing wafers in the vacuum atmosphere. A "vacuum atmosphere" is to be understood, in particular, as an atmosphere, the pressure of which is below 300 hPa, preferably below 1 hPa, in a preferred manner below $10^{-3}$ hPa and in a particularly preferred manner below $10^{-6}$ hPa. The wafer transportation container comprises, in particular, a high level of tightness in the vacuum atmosphere, in particular the leakage rate of the wafer transportation container being less than $10^{-4}$ mbar*l/s, preferably less than $10^{-5}$ mbar*l/s, advantageously less than $10^{-6}$ mbar*l/s, particularly advantageously less than $10^{-7}$ mbar*l/s, in a preferred manner less than $10^{-8}$ mbar*l/s and in a particularly preferred manner less than $10^{-9}$ mbar*l/s. As an alternative to this, the wafer transportation container can be configured for storing and/or keeping wafers in a standard atmosphere and/or in a specially compiled atmosphere, for example a nitrogen atmosphere. The wafer transportation container comprises, in particular, an outer shell which is realized at least partly from an, in particular diamagnetic, paramagnetic or ferromagnetic, material which is preferably repelled and/or attracted by an external magnetic field.

A "loading and/or unloading position" is to be understood, in particular, as a position of the wafer transportation container relative to the loading and/or unloading station which is configured for reloading at least one wafer from the wafer transportation container into the loading and/or unloading station and/or reloading at least one wafer from the loading and/or unloading station into the wafer transportation container. In the loading and/or unloading position, the wafer transportation container, in particular an interior of the wafer transportation container, is connectable to the loading and/or unloading station, in particular to an interior of the loading and/or unloading station, preferably in a vacuum-tight manner. In particular, in the loading and/or unloading position, a wafer transportation container opening element is releasable from a base body of the wafer transportation container and is lowerable in particular at least partly into an interior of the loading and/or unloading station. In particular, the wafer transportation container in the loading and/or unloading position is firmly fixable on a surface of the loading and/or unloading station, for example by means of vacuum clamping by a vacuum clamping device. In particular, the wafer transportation container and the loading and/or unloading station are configured for the purpose of realizing a common mini-environment, in particular in a coupled state in which the wafer transportation container is fixed on the surface of the loading and/or unloading station in the loading and/or unloading position. A "mini-environment" is to be understood, in particular, as an enclosure with an atmosphere which is isolated from a surrounding atmosphere, for example a vacuum. A "coupling process" is to be understood, in this connection, in particular, as a process of approaching the wafer transportation container to and/or removing the wafer transportation container from the loading and/or unloading station for subsequently fixing the wafer transportation container on the loading and/or unloading station in the loading and/or unloading position. A "wafer" is to be understood, in particular, as a substrate for electronic components. The loading and/or unloading station is additionally configured, in particular, for the purpose of forwarding wafers from the wafer transportation container to a wafer process module, which is configured, in particular, for performing at least one processing and/or manufacturing step on a wafer, and/or to conduct processed wafers from a wafer process module to a wafer transportation container for further transportation, for example to a further wafer process module.

A "positioning mechanism" is configured, in particular, for the purpose of generating, controlling and/or regulating a force and/or an acceleration which serves for adjusting a location and/or position of the wafer transportation container. The positioning mechanism "contactlessly positioning" the wafer transportation container is to be understood, in particular, as a force transmission of a positioning force of the positioning mechanism, which acts between the wafer transportation container and the loading and/or unloading station, being effected at least partly contactlessly, in particular the wafer transportation container and the loading and/or unloading station being free of any mutual contact points. In particular, contactless positioning is independent of ropes and/or cables, or of forces and/or acceleration generated by ropes and/or cables, independent of any positioning of the wafer transportation container transport system which is configured, in particular, for logistics of wafer transportation containers inside the wafer fabrication plant, and/or independent of guide elements and/or positive locking elements of the wafer transportation container and/or of the loading and/or unloading station, such as, for example, guide pins. Contactless positioning can be effected, for example, by means of magnetic forces, electrostatic forces and/or impulse forces of a flowing fluid, in particular a gas.

Positioning by the positioning mechanism is effected, in particular, in a plane which lies at least substantially perpendicular to a coupling direction. The "coupling direction" is realized, in particular, as a main direction of movement, along which the wafer transportation container moves during the coupling process. The coupling direction extends, in particular, at least substantially perpendicularly to a main extension plane of the wafer transportation container opening element. The coupling direction is preferably realized at least substantially parallel to a direction of gravity. A "main extension plane" of a structural unit is to be understood, in particular, as a plane which is parallel to a largest side surface of a smallest imaginary cuboid which barely surrounds the structural unit in full, and which, in particular, extends through the center point of the cuboid. "Substantially parallel" is to be understood here, in particular, as an alignment of a direction relative to a reference direction, in particular in one plane, the direction comprising a deviation of in particular less than 8°, advantageously less than 5° and particularly advantageously less than 2° in relation to the reference direction. The expression "substantially perpendicularly" is to define here, in particular, an alignment of a direction relative to a reference direction, the direction and the reference direction, in particular when viewed in one plane, enclosing an angle of 90° and the angle comprising a maximum deviation of, in particular, less than 8°, advantageously less than 5° and particularly advantageously less than 2°. As an alternative to this or in addition to it, positioning by means of the positioning mechanism can be effected in a direction which extends parallel to the coupling direction.

It is additionally proposed that the positioning mechanism is configured for proximity positioning of the wafer transportation container in the loading and/or unloading position. Precise positioning, in particular pre-positioning, of the wafer transportation container in the loading and/or unloading position can be made possible advantageously as a result. In addition, positioning that has already been set up, in particular pre-positioning, can advantageously be prevented from being re-adjusted in the case of a subsequent further approach to the loading and/or unloading position as a result of positioning the wafer transportation container in proximity to the loading and/or unloading station. A high level of effectiveness of the positioning can be advantageously achieved as a result. Prior to the positioning, rapid rough positioning takes place, in particular, outside the area of proximity. A "proximity positioning" is to mean, in particular, a positioning of the wafer transportation container in a proximity to the loading and/or unloading position of the loading and/or unloading station. The positioning mechanism is arranged, in particular, in a proximity to the loading and/or unloading station. The positioning mechanism is configured, in particular, for the purpose of generating a force which preferably acts in proximity to the loading and/or unloading station and/or develops its greatest effect in a proximity to the loading and/or unloading station. A "proximity" to an object is to be understood, in particular, as a region of points in space, each point in space being removed by no more than 1 m, preferably by no more than 20 cm, advantageously by no more than 10 cm, particularly advantageously by no more than 5 cm, in a preferred manner by no more than 2 cm and in a particularly preferred manner by no more than 0.5 cm from the object, in particular from a contact surface of the loading and/or unloading station which is preferably configured for the purpose of contacting the wafer transportation container in a contacting manner in the loading and/or unloading position. The wafer transportation container and the loading and/or unloading station are, in particular, free of mutual contacting in the region of immediate proximity. The region of immediate proximity is realized, in particular, differently from a contacting region in which the wafer transportation container and the loading and/or unloading station contact one another mutually.

In addition, it is proposed that the positioning mechanism is configured for positioning the wafer transportation container such that a deviation from an ideal loading and/or unloading position, in particular in a plane perpendicular to the coupling direction, is no more than 3 mm, preferably no more than 2.5 mm, advantageously no more than 2 mm, in a preferred manner no more than 1.5 mm and in a particularly preferred manner no more than 1 mm. As a result, it is advantageously possible to achieve particularly precise positioning of the wafer transportation container in the loading and/or unloading position. In particular, it is possible to achieve, as a result, very precise matching of pre-positioning by the positioning mechanism with a final positioning mechanism, which includes positioning pins, as a result of which particle generation, in particular as a result of friction produced by the final positioning mechanism, is advantageously able to be kept low. Particularly advantageous characteristics with regard to clean room suitability and/or vacuum suitability of the positioning mechanism can be created as a result. The positioning mechanism is configured, in particular, for the purpose of generating a force, the force effect of which and/or the force gradient of which is adjustable within a millimeter range, in particular by means of a controller of the positioning device. A "controller" is to be understood, in particular, as an electronic unit which is preferably configured for the purpose of controlling and/or regulating at least the positioning mechanism, in particular at least one positioning element of the positioning mechanism. The controller preferably includes a processor and, in particular in addition to the processor, a storage unit with a control and/or regulation program stored therein which is configured to be executed by the processor. The "ideal loading and/or unloading position" is realized, in particular, as a position of the wafer transportation container in which a contact region of the wafer transportation container, in particular of the wafer transportation container opening element, and a contact region of an opening element of the loading and/or unloading station ideally overlap, in particular in such a manner that maximum gas tightness of the connection between wafer transportation container and loading and/or unloading station is achieved. In particular, an entire overlap region, in particular when seen in the coupling direction, realized by the contact region of the wafer transportation container opening element and by the contact region of the opening element of the loading and/or unloading station, is minimized where there is an ideal overlap. The "deviation from the ideal final position" is to be understood, in particular, as an, in particular spatial and/or rotational, deviation of the positioning set up by the positioning mechanism from a final positioning set up by a final positioning mechanism which follows the positioning mechanism.

Furthermore, it is proposed that the positioning device comprises a controller which is configured for controlling and/or regulating the positioning of the wafer transportation container by means of the positioning mechanism, in particular, at least in a plane which is parallel to the loading and/or unloading position. A high level of precision of the positioning achievable by means of the positioning device can be made advantageously possible as a result. In addition, it is advantageously possible to adapt positioning flexibly to initial positioning or to rough positioning. In addition, it is advantageously possible to adapt positioning flexibly to different, in particular differently formed, wafer transportation containers. In particular, the controller is configured at least for controlling a magnetic field of the positioning mechanism. In particular, the controller is configured at least for the purpose of controlling an electrostatic field of the positioning mechanism. In particular, the controller is configured at least for the purpose of controlling a flow field of a flowing fluid of the positioning mechanism. In particular, the controller is provided at least for the purpose of controlling and/or regulating an intensity, an alignment, a location and/or a position of the magnetic field, of the electrostatic field and/or of the flow field.

It is additionally proposed that the positioning mechanism includes at least one positioning element which is configured for the purpose of generating at least one, in particular contactlessly transmissible, positioning force field. As a result, it is possible to achieve advantageous characteristics with regard to positioning a wafer transportation container on a loading and/or unloading station for wafers from the wafer transportation container. In particular, it is advantageously possible, by means of the positioning mechanism, to reduce and/or avoid particle generation during a coupling process, in particular by external friction, leading in particular to particle generation between solid bodies, in particular between the wafer transportation container and the loading and/or unloading station, being able to be avoided. The positioning element is configured, in particular, for the purpose of generating a magnetic field, an electrical, in particular an electrostatic, field and/or a flow field. The positioning element includes, in particular, at least one magnetic coil, at least one electrically chargeable, preferably electrically isolable, conductor surface and/or at least one nozzle for a fluid. The positioning element is realized, in particular, at least partly integrally with the loading and/or unloading station, in particular the opening element of the loading and/or unloading station, and/or with the wafer transportation container. The positioning force field is realized, in particular, as a magnetic field, as an electrical field, as an electrostatic field and/or as a fluid flow field, in particular a gas flow field. It is conceivable for a plurality of similar-type and/or different-type positioning force fields of one individual positioning element and/or of a plurality of positioning elements to overlap. It is imaginable, in particular for at least one positioning force field of the positioning element to be realized in a controllable and/or regulatable manner. It is additionally imaginable for at least one positioning force field of the positioning element to be realized in a static manner. "Integrally" is to be understood, in particular, as connected at least in a substance-to-substance bond, for example as a result of a welding process, a bonding process, an injection process and/or another process which appears sensible to the expert, and/or formed advantageously in one piece, such as, for example, as a result of production from a cast and/or as a result of production using a single-component or multi-component injection molding method and advantageously from one single blank.

It is additionally proposed that the positioning mechanism includes at least one further positioning element, preferably at least two further, in a preferred manner at least three further and in a particularly preferred manner more than three further positioning elements, which is/are configured for the purpose of generating at least one further positioning force field, preferably at least two further, in a preferred manner at least three further and in a particularly preferred manner more than three further, in particular contactlessly transmissible, positioning force fields. As a result, particularly precise positioning is advantageously possible. In particular, as a result, it is possible to achieve a particularly high level of precision of the control and/or the regulating of the positioning. It is possible advantageously, as a result, to overlap different and/or similar-type force fields, in particular for an increase in control precision. In particular, a further positioning element can be realized as a positioning element which corresponds to the positioning element. It is imaginable, for example, for a positioning element arranged at the loading and/or unloading station to generate a controllable and/or regulatable magnetic field by means of a magnetic coil which is configured for the purpose of interacting with a static magnetic field of a corresponding positioning element, which is realized as a permanent magnet and is arranged on a wafer transportation container.

If the positioning mechanism, in particular the positioning element, is configured for the purpose of generating, for the positioning, at least one repulsion force, which acts, in particular, in a repulsive manner on the wafer transportation container, a risk of unintended, particle-generating contact between an object to be positioned by the positioning mechanism and a positioning element and/or a further object, for example by oversteering an attracting force, is able to be advantageously avoided, as a result of which it is advantageously possible to keep a number of particles generated by the positioning mechanism low. A "repulsion force" is to be understood, in particular, as a force which is configured for the purpose of deflecting and/or pressing the wafer transportation container in a direction which is aligned pointing away from the positioning element generating the repulsion force.

It is additionally proposed that at least one positioning element is configured at least for the purpose of generating at least one positioning force field which is realized as a magnetic field. As a result, it is possible to achieve an effective contactless force transmission, as a result of which, in particular, particle generation can be reduced and/or avoided. In addition, in particular one magnetic field and/or a combination of magnetic fields is/are simply and/or precisely controllable and/or regulatable and are variable in particular in a particularly small space.

When at least one, in particular corresponding, positioning element is realized at least partly as a permanent magnet, it is advantageously possible to generate a positioning force field in a currentless manner. A positioning element realized as a permanent magnet advantageously reinforces a reaction to a change in a positioning force field, which is produced by a controllable positioning element and is overlapped with the positioning force field of the positioning element realized as a permanent magnet, as a result of which an output required for actuating a positioning action can advantageously be kept small. The positioning element which is realized as a permanent magnet is arranged, in particular, on the wafer transportation container.

If at least one positioning element is realized at least partly integrally with the wafer transportation container, a simple design of the positioning mechanism is advantageously made possible. In particular, the positioning element realized integrally with the wafer transportation container is realized as a permanent magnet and/or as a diamagnetic, paramagnetic and/or ferromagnetic element. The positioning element is realized, in particular, at least partially from a diamagnetic, paramagnetic and/or ferromagnetic material. In particular, the positioning element realized integrally with the wafer transportation container is realized integrally with the wafer transportation container opening element and/or with the base body of the wafer transportation container. The wafer transportation container preferably includes a plurality of positioning elements, of which preferably at least part is realized at least partly integrally with the wafer transportation container. It is additionally imaginable for an outer shell of the wafer transportation container to realize an, in particular corresponding, positioning element.

It is additionally proposed that at least one positioning element is connected in a captive manner to the loading and/or unloading station. As a result, positioning relative to the loading and/or unloading station, in particular to a surface of the loading and/or unloading station, is advantageously made possible. The term "connected in a captive manner" is to be understood, in particular, as the positioning element and the loading and/or unloading station being connected together in any provided operating state. In an advantageous manner, the positioning element and the loading and/or unloading station are only separable from one another by means of a tool, only as a result of destruction and/or only with loss of function. The positioning element is preferably connected in a captive manner to a non-movable component of the loading and/or unloading station. As an alternative to this, the positioning element can also be connected in a captive manner to a movably supported component of the loading and/or unloading station, for example to the opening element of the loading and/or unloading station.

If the positioning element is supported so as to be movable relative to the loading and/or unloading station, a particularly wide variability in the positioning force field can advantageously be made possible, as a result of which, in particular, particularly precise positioning of the wafer transportation container can be made possible. It is imaginable, in particular, for the positioning element to be configured at least partly for the purpose of following a vertical movement of the wafer transportation container in the direction of the loading and/or unloading position or of the surface of the opening element of the loading and/or unloading unit, for example during a coupling and/or uncoupling process. The phrase "supported so as to be movable" is to mean, in particular, at least translationally supported, at least pivotably supported and/or at least rotationally supported. The positioning element is preferably supported so as to be movable at least relative to the surface of the loading and/or unloading station and/or to the opening element of the loading and/or unloading station. In particular, the positioning element is mounted so as to be pivotable around at least one, preferably at least two axes, preferably at least one axis being aligned perpendicularly or horizontally relative to the surface of the loading and/or unloading station. In particular, the positioning element is supported so as to be translationally movable in at least one, preferably at least two, in a preferred manner at least three and in a particularly preferred manner at least four spatial directions, the spatial directions including at least one, preferably at least two, direction(s) which extend parallel to the surface of the loading and/or unloading station, at least one direction which extends perpendicularly to the surface of the loading and/or unloading station and/or at least one direction which extends in a circumferential direction along a cylinder mantle of an imaginary cylinder which points away perpendicularly from the surface of the loading and/or unloading station.

It is additionally proposed that at least one, in particular one further, positioning element is configured for the purpose of generating at least one positioning force field which is realized as an electrical field, in particular an electrostatic field. As a result, it is advantageously possible to achieve an effective contactless force transmission, as a result of which, in particular, particle generation is able to be reduced and/or avoided.

It is additionally proposed that at least one, in particular additional further, positioning element is configured for the purpose of generating at least one positioning force field which is realized as a flow field of a flowing gas. As a result, it is advantageously possible to achieve an effective contactless force transmission, as a result of which, in particular, particle generation is able to be reduced and/or avoided.

It is additionally proposed that the positioning mechanism comprises at least one nozzle for generating an at least partly directed gas flow, the gas flow, in particular an average overall gas flow of a flow field generated by the nozzle, being aligned at least substantially parallel to the coupling direction of the positioning device. As a result, it is advantageously possible to guide the wafer transportation container in the coupling direction. The nozzle is arranged, in particular, in the surface of the loading and/or unloading station. The nozzle is arranged, in particular, in a circumferential direction around the opening element of the loading and/or unloading station. The nozzle is preferably provided for the purpose of generating an air curtain around the opening element of the loading and/or unloading station. As a result of such alignment of the gas flow perpendicular to the surface of the loading and/or unloading station, particles can advantageously be kept away from the surface of the loading and/or unloading station. The nozzle is configured, in particular, for a sucking functionality. As an alternative to this, the nozzle can also be configured for a blowing functionality.

If at least one, in particular further, gas flow of the positioning element, in particular an average overall gas flow of the flow field, is aligned at least substantially perpendicularly to a coupling direction of the positioning device, contactless positioning of the wafer transportation container can advantageously be made possible in a plane parallel to the surface of the loading and/or unloading station. In particular, the positioning element comprises at least one nozzle which is configured, in particular, for the purpose of providing an outlet opening and/or an inlet opening for flowing gas, in particular flowing air. The nozzle is realized, in particular, so as to be movable. In particular, the direction of the gas flow emerging from the nozzle is adjustable by means of the controller. The nozzle of the positioning element is configured, in particular, for a blowing functionality. In the case of the blowing functionality, the gas flow presses the wafer transportation container in particular in a direction which points away from the positioning element, in particular from the nozzle. As an alternative to this, the nozzle can also be provided for a sucking functionality. In the case of the sucking functionality, the gas flow pulls the wafer transportation container in particular in a direction which points to the positioning element, in particular to the nozzle.

It is additionally proposed that the positioning device comprises a check unit for, in particular three-dimensional, position check, in particular real time position check, and/or for, preferably controlled, position regulation of an actual position, of the wafer transportation container during the coupling process. As a result, it is advantageously possible to achieve a high level of precision of positioning, in particular by actively controlling and/or regulating a positioning process. In addition, it is also advantageously possible to increase operational reliability as a result, in particular by allowing a check of a positioning of the wafer transportation container that has been performed, in particular prior to opening the wafer transportation container. In particular, the check unit is configured for the purpose of detecting a current position of the wafer transportation container and, where applicable, of actuating at least one positioning element for a position correction, in particular by means of varying the positioning force field of the positioning element and/or by means of varying a spatial position and/or spatial orientation of the positioning element. A "three-dimensional position check" is to be understood, in particular, as at least one position check of a spatial position of the wafer transportation container inside a plane which is parallel to the surface of the loading and/or unloading station and/or a position check of a rotational position of the wafer transportation container. "Real-time position check" is to be understood, in particular, as at least one position check by means of which a spatial and/or rotational actual position of the wafer transportation container detected by the check unit is read directly by the controller, whereupon in particular a spatial and/or rotational required position of the wafer transportation container is determined by the controller and whereupon in particular at least one control and/or regulating command for a position correction of the actual position of the wafer transportation container is output by the controller to at least one positioning element. "Positioning regulation" is to be understood, in particular, as a process in which an actual position of the wafer transportation container recognized by the check unit is moved closer to a predefined required position of the wafer transportation container by means of controlling and/or regulating at least one positioning force field. In particular, the required position of the wafer transportation container, in particular in the state where the wafer transportation container is coupled with the loading and/or unloading station, realizes the ideal loading and/or unloading position and/or a position in which the wafer transportation container and the loading and/or unloading station, in particular along the coupling direction, overlap in an ideal manner.

It is additionally proposed that the check unit comprises at least one sensor unit, wherein the sensor unit is realized at least partly integrally with the positioning mechanism, in particular the positioning element. As a result, complexity is able to be reduced, in particular by one individual component being able to be assigned multiple tasks. Two units being realized "at least partly integrally" is to be understood, in particular, as the units comprising at least one, in particular at least two, advantageously at least three common elements which are a component part, in particular a functionally important component part, of the two units. The sensor unit comprises, in particular, at least one sensor element. The sensor element is configured, in particular, at least for the purpose of sensing a parameter of the positioning device, of the wafer transportation container and/or of the loading and/or unloading station. The parameter of the positioning device can include, in particular, a rotational position and/or movement of the wafer transportation container, a spatial position and/or movement of the wafer transportation container and/or a distance and/or a distance modification between the wafer transportation container and the sensor element. The sensor element is preferably configured at least for the purpose of sensing a spatial position and/or movement of the wafer transportation container relative to the surface of the loading and/or unloading station. In particular, the sensor element is realized as at least one magnetic coil which is preferably configured for the purpose of generating a positioning force field which is realized as a magnetic field. In particular, the sensor element is configured for the purpose of sensing, preferably at the same time as generating a positioning force field, the parameter of the positioning device by way of measurements of counter flows induced by magnetic fields, in particular by overlapping positioning force fields, in particular in the conducting path of the magnetic coil. As an alternative to this or in addition to it, the sensor unit can comprise at least one sensor element which is realized separately from the positioning mechanism, in particular the positioning element. In particular, the sensor unit can include at least one sensor element which is realized as an optical sensor, for example a camera and/or a light barrier.

If the positioning device comprises a final positioning mechanism, wherein the positioning mechanism is realized at least partly separately from the final positioning mechanism, it is possible to achieve advantageous characteristics with regard to positioning a wafer transportation container on a loading and/or unloading station for wafers from the wafer transportation container. In particular, it is advantageously possible to reduce particle generation during a coupling process by means of the positioning mechanism, in particular by external friction, in particular leading to particle generation, between solid bodies, in particular between the wafer transportation container and the loading and/or unloading station, being able to be avoided during positioning, in particular pre-positioning, by means of the positioning mechanism and preferably being able to be limited to the final positioning mechanism. In particular, as a result of precise positioning in the run-up to the final positioning, friction during final positioning is able to be minimized in an advantageous manner. The final positioning mechanism includes, in particular, a guide unit which is configured, in particular, for the purpose of determining final positioning of the wafer transportation container in the ideal loading and/or unloading position by means of guiding a guide element of the guide unit in a guide rail of the guide unit. The guide unit preferably includes a plurality of guide elements and guide rails. In particular, the guide elements and/or guide rails are arranged on a surface of the wafer transportation container opening element, arranged in particular on an outside of the wafer transportation container, on the surface of the loading and/or unloading station, in particular arranged on an outside of the loading and/or unloading station, and/or of the opening element of the loading and/or unloading station. In addition, the positioning device comprises a rough positioning mechanism which is realized at least partially separated from the positioning mechanism and/or the final positioning mechanism. In particular, the rough positioning mechanism includes positioning by means of the wafer transportation container transport system of the wafer fabrication plant which holds, in particular, the wafer transportation container by means of ropes and/or cables and positions it roughly relative to the loading and/or unloading station.

Additionally proposed is a loading and/or unloading system for loading and/or unloading wafers from a wafer transportation container, having the wafer transportation container, having the loading and/or unloading station and having the positioning device, in particular the wafer transportation container positioning device. As a result of the loading and/or unloading system according to the invention, it is possible to achieve advantageous characteristics with regard to positioning a wafer transportation container on a loading and/or unloading station for wafers from the wafer transportation container. In particular, particle generation can be advantageously reduced when the wafer transportation container is positioned on the loading and/or unloading station.

Also proposed is a method for operating the positioning device, in particular the wafer transportation container positioning device, and/or of the loading and/or unloading system, wherein in the case of the coupling process between a wafer transportation container and the loading and/or unloading station, the wafer transportation container is positioned contactlessly relative to the loading and/or unloading station. As a result, it is possible to keep particle generation low during positioning.

It is additionally proposed that the wafer transportation container is positioned in particular by means of the positioning device following external rough positioning. As a result, high effectivity of positioning can be advantageously achieved.

The positioning device according to the invention, in particular the wafer transportation container positioning device, the loading and/or unloading system according to the invention and/or the method according to the invention is/are not to be limited in this connection to the above-described application and embodiment. In particular, the positioning device according to the invention, in particular the wafer transportation container positioning device, the loading and/or unloading system according to the invention and/or the method according to the invention, for fulfilling a functionality described herein, can comprise a number of individual elements, components, units and method steps which deviates from a number named herein.

DRAWINGS

Further advantages are produced from the following description of the drawing.

Four exemplary embodiments of the invention are shown in the drawings. The drawings, the description and the claims include numerous features in combination. The expert will also look at the features individually in an expedient manner and combine them to form sensible further combinations.

Figure 2:
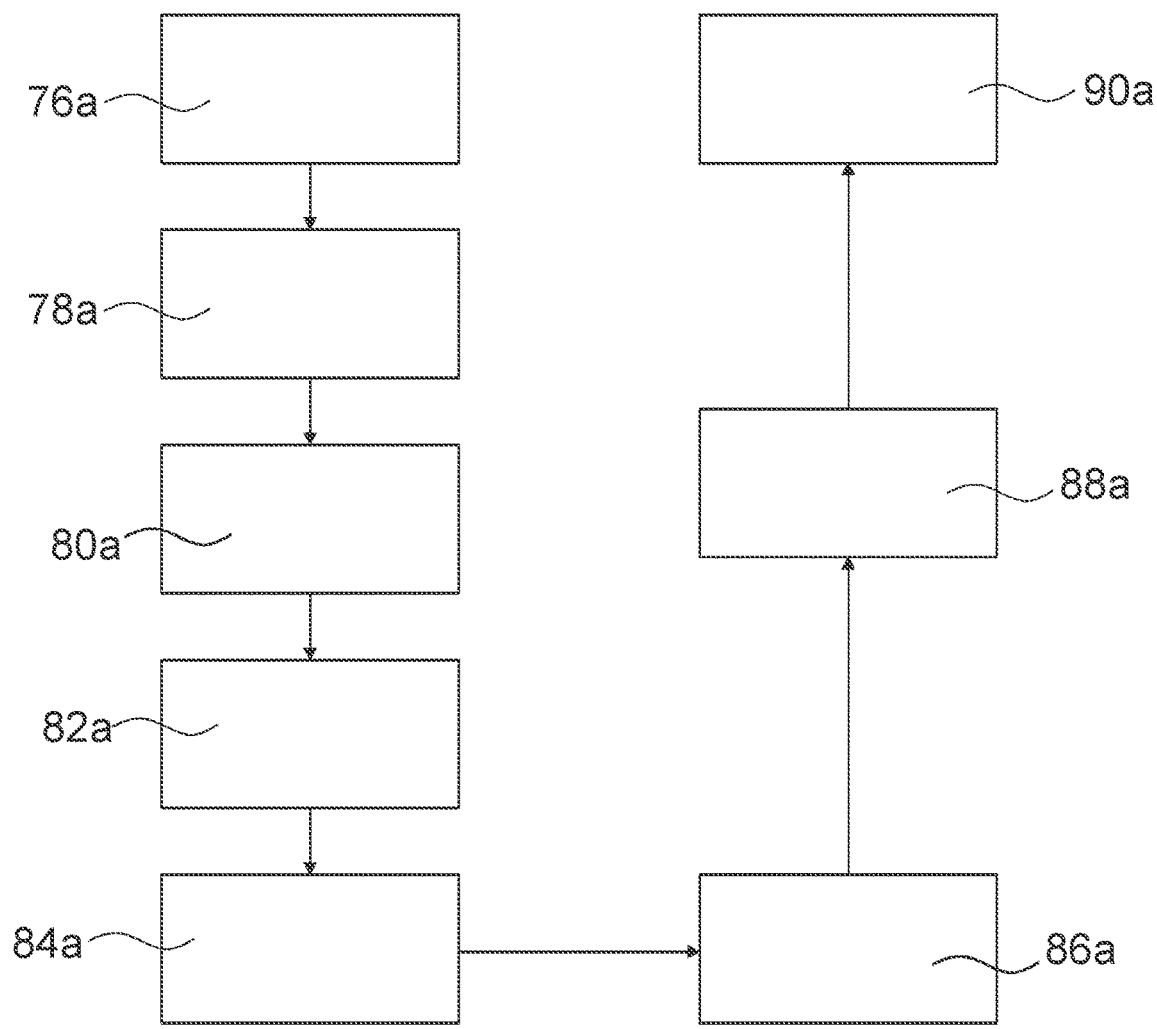
Figure 3:
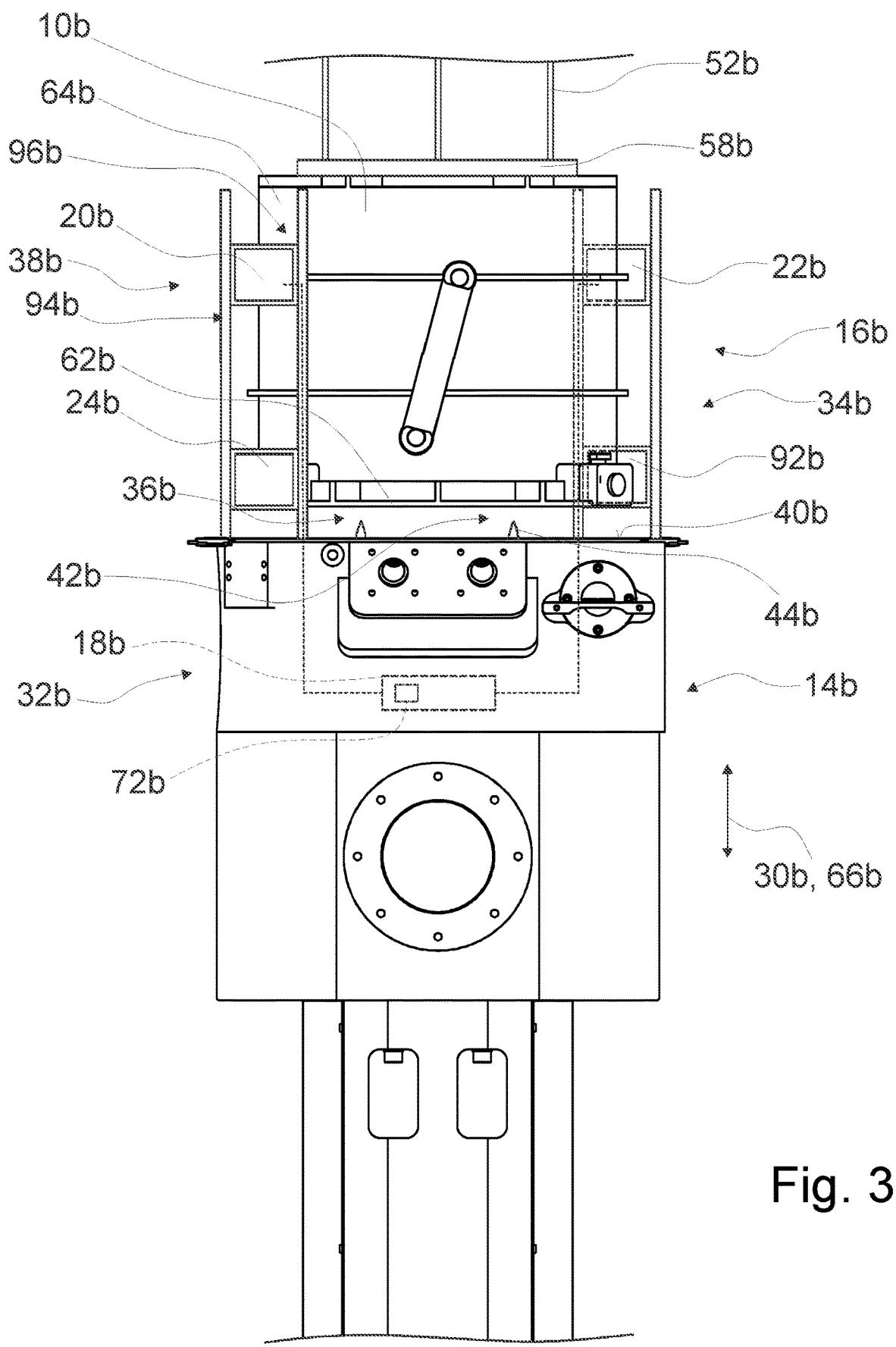
Figure 4:
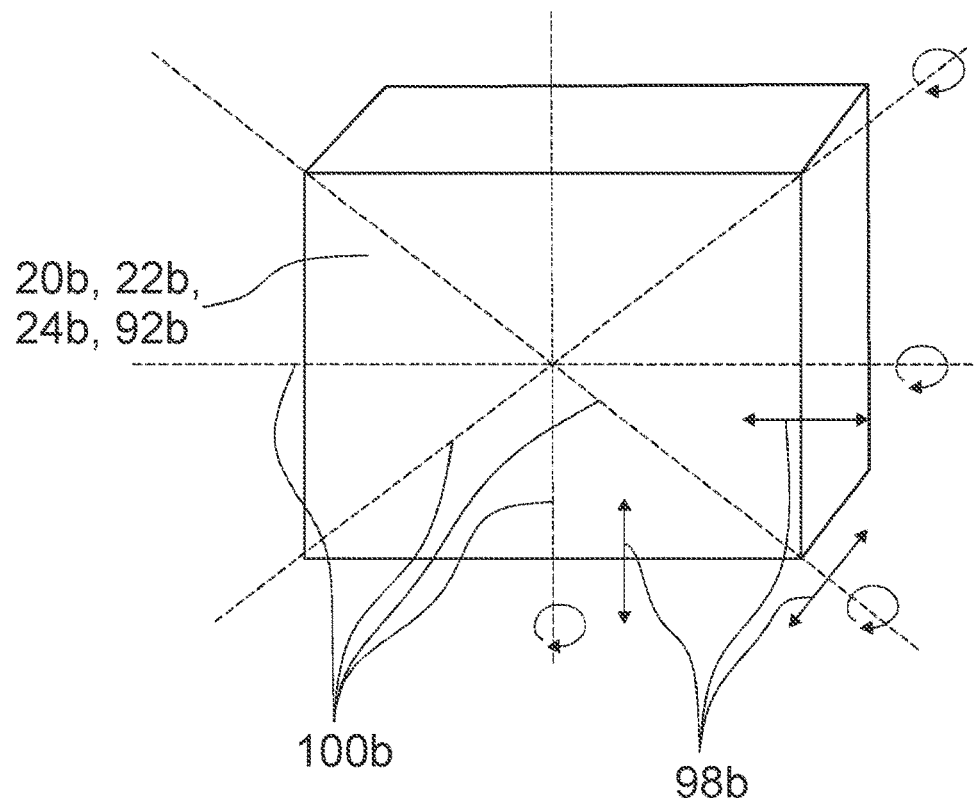
Figure 5:
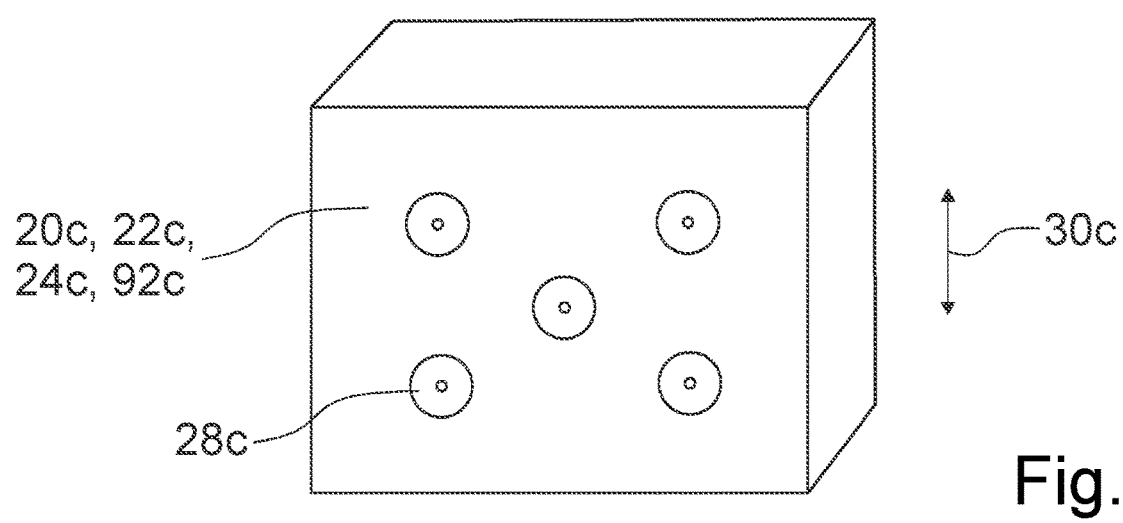
Figure 6:
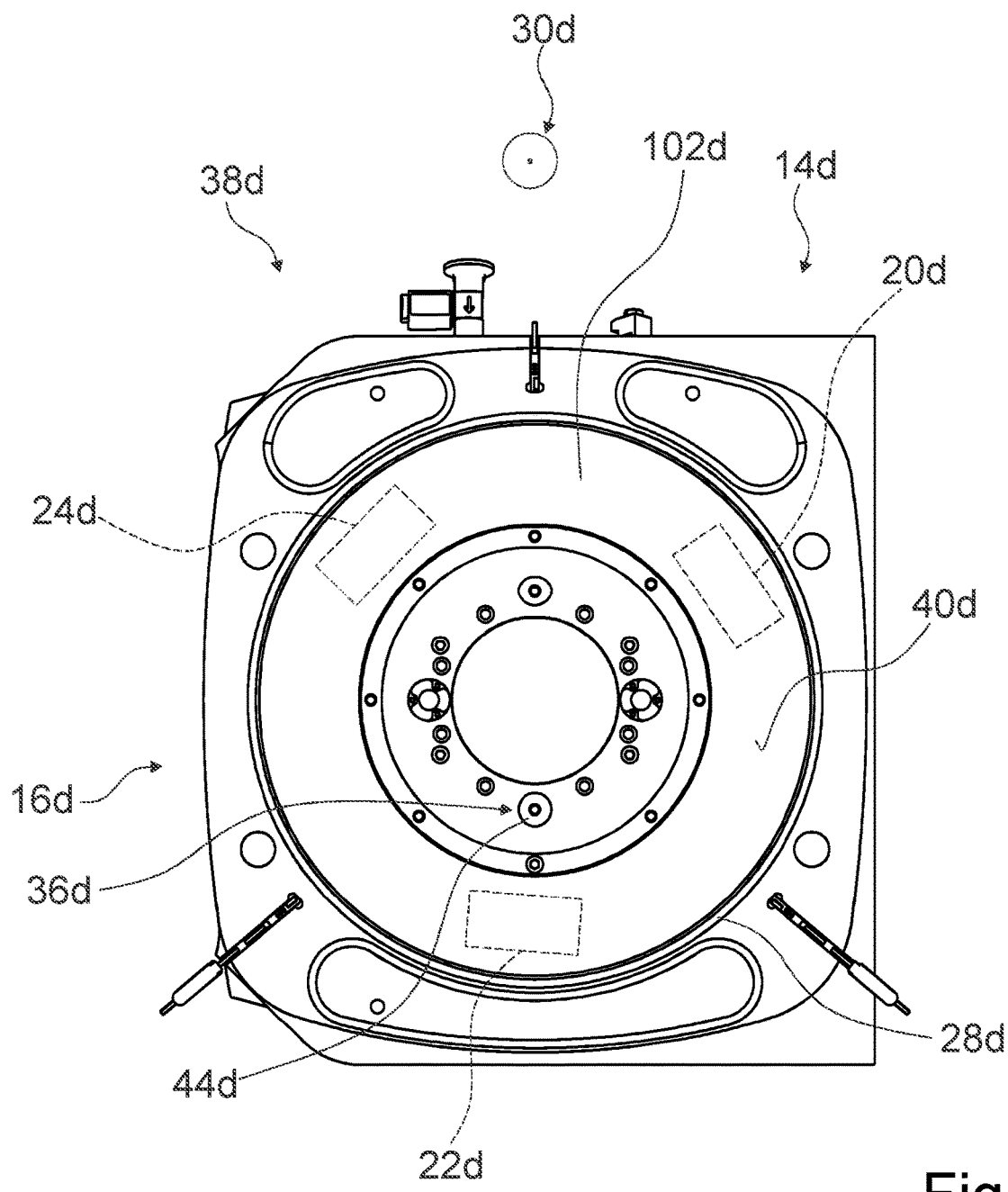

The figures are as follows:

FIG. 1 shows a schematic representation of a loading and/or unloading system with a wafer transportation container, with a loading and/or unloading station and with a positioning device, FIG. 2 shows a flow diagram of a method for operating the positioning device, FIG. 3 shows a schematic representation of an alternative loading and/or unloading system with an alternative positioning device, FIG. 4 shows a schematic representation of an alternative positioning element of the alternative positioning device, FIG. 5 shows a schematic representation of a further alternative positioning element of a further alternative positioning device and FIG. 6 shows a schematic top view of an additional alternative loading and/or unloading station with an additional alternative positioning element of an additional further alternative positioning device.

DESCRIPTION OF THE EXEMPLARY EMBODIMENTS

FIG. 1 shows a loading and/or unloading system 38a. The loading and/or unloading system 38a includes a wafer transportation container 10a. The wafer transportation container 10a is configured for transportation and/or storage of wafers 12a. The loading and/or unloading system 38a is configured for loading and/or unloading wafers 12a from the wafer transportation container 10a. The wafer transportation container 10a comprises a wafer transportation container opening element 62a. The wafer transportation container 10a comprises a base body 64a. The wafer transportation container opening element 62a is configured for closing an opening of the base body 64a of the wafer transportation container 10a. The wafer transportation container opening element 62a is realized so as to be removable from the base body 64a of the wafer transportation container 10a.

The loading and/or unloading system 38a comprises a loading and/or unloading station 14a. The loading and/or unloading station 14a is configured for loading and/or unloading wafers 12a from the wafer transportation container 10a. For loading and/or unloading wafers 12a, the loading and/or unloading station 14a opens the wafer transportation container 10a by releasing the wafer transportation container opening element 62a from the base body 64a of the wafer transportation container 10a. For opening the wafer transportation container 10a, the loading and/or unloading station 14a moves the wafer transportation container opening element 62a in a loading and/or unloading direction 66a. The loading and/or unloading direction 66a extends at least substantially perpendicularly to a main extension plane of the wafer transportation container opening element 62a. When being opened, the wafer transportation container opening element 62a is lowered by means of the loading and/or unloading station 14a into an interior of the loading and/or unloading station 14a. When the wafer transportation container 10a is loaded and/or unloaded, an interior of the base body 64a of the wafer transportation container 10a is connected in a vacuum-tight manner to the interior of the loading and/or unloading station 14a. The loading and/or unloading station 14a is configured for further transportation of wafers 12a, unloaded from the wafer transportation container 10a, to at least one wafer process module (not shown).

The loading and/or unloading station 14a comprises a surface 40a which is configured for the wafer transportation container 10a to be placed thereon in a contacting manner. The loading and/or unloading station 14a comprises a loading and/or unloading position. The loading and/or unloading position is realized as the position in which the wafer transportation container 10a is placed on the loading and/or unloading station 14a and, by realizing a vacuum-tight connection between the interior of the loading and/or unloading station 14a and the interior of the wafer transportation container 10a, is able to be loaded and/or unloaded. The loading and/or unloading position is arranged on the surface 40a of the loading and/or unloading station 14a. In the representation shown in FIG. 1, the loading and/or unloading system 38a is situated in a non-coupled state. The wafer transportation container 10a is free of contact with the loading and/or unloading station 14a. The wafer transportation container 10a is situated in proximity to the loading and/or unloading station 14a.

The loading and/or unloading system 38a comprises a wafer transportation container transport system 50a. The wafer transportation container transport system 50a is configured for transporting wafer transportation containers 10a between different loading and/or unloading systems 38a and/or further devices of a wafer fabrication plant. The wafer transportation container transport system 50a is realized as a cleanroom-compatible overhead hoist transport (OHT) system. As of an alternative to this, the wafer transportation container transport system 50a can also be realized as another type of transport system for wafer transportation containers 10a. For example, a system of self-flying drones could also be configured for the purpose of transporting the wafer transportation containers 10a toward the loading and/or unloading station 14a or away from the loading and/or unloading station 14a. The wafer transportation container transport system 50a comprises a rail system 56a. The rail system 56a includes at least one rail which is configured for the purpose of predefining a transport path.

The wafer transportation container transport system 50a comprises a transport carriage 54a. The transport carriage 54a is configured for the purpose of being moved or moving along rails of the rail system 56a. The transport carriage 54a comprises a base body 70a. The transport carriage 54a comprises a holder 58a. The holder 58a is configured for the purpose of receiving the wafer transportation container 10a. The holder 58a is configured for the purpose of retaining the wafer transportation container 10a during transport by means of the transport carriage 54a, during rough positioning, during positioning, during pre-positioning and/or during final positioning. The holder 58a is configured for the purpose of holding the wafer transportation container 10a releasably. The transport carriage 54a comprises a plurality of holding elements 52a. The holding elements 52a are realized in an elongated manner. The holding elements 52a are realized in a limp manner. The holding elements 52a are realized as cables and/or ropes. The holding elements 52a realize a connection between the holder 58a and the base body 70a of the transport carriage 54a. A distance between the base body 70a of the transport carriage 54a and the holder 58a is variable. The holding elements 52a can be wound up for varying the distance between the base body 70a of the transport carriage 54a and the holder 58a. The transport carriage 54a realizes a rough positioning mechanism 60a for the wafer transportation container 10a. The rough positioning mechanism 60a is configured for rough positioning of the wafer transportation container 10a relative to the loading and/or unloading station 14a.

The transport carriage 54a comprises a controller 68a. The controller 68a of the transport carriage 54a is configured for controlling and/or regulating the holder 58a, the holding elements 52a, in particular the length of the holding elements 52a. The controller 68a of the transport carriage 54a is configured for controlling and/or regulating the rough positioning mechanism 60a. The controller 68a of the transport carriage 54a is configured for controlling and/or regulating the movement of the transport carriage 54a along the rail system 56a. The controller 68a of the transport carriage 54a comprises a communication module 74a. The communication module 74a of the controller 68a of the transport carriage 54a is configured for the purpose of receiving control and/or regulating commands for controlling and/or regulating the transport carriage 54a, the holder 58a and/or the holding elements 52a. The communication module 74a of the controller 68a of the transport carriage 54a is configured for the purpose of emitting control and/or regulating commands of the controller 68a of the transport carriage 54a to a further controller, for example of a further transport carriage and/or of a further loading and/or unloading station 14a.

The loading and/or unloading system 38a comprises a positioning device. The positioning device realizes a wafer transportation container positioning device. The positioning device is configured for positioning the wafer transportation container 10a in the loading and/or unloading position. The positioning device is configured for pre-positioning the wafer transportation container 10a in the loading and/or unloading position. The loading and/or unloading position 38a comprises a positioning mechanism 16a. The positioning mechanism 16a is configured for contactless positioning of the wafer transportation container 10a in a coupling process between the wafer transportation container 10a and the loading and/or unloading station 14a. The positioning mechanism 16a is configured for the purpose of generating a repulsion and/or an attraction force for the positioning. The positioning mechanism 16a is realized separately from the rough positioning mechanism 60a. The positioning mechanism 16a is realized independently of the wafer transportation container transport system 50a, in particular independently of a movement of the wafer transportation container transport system 50a. The positioning mechanism 16a is realized independently of the holding elements 52a.

The positioning mechanism 16a is configured for proximity positioning of the wafer transportation container 10a in the loading and/or unloading position. The positioning mechanism 16a is configured for positioning the wafer transportation container in a horizontal plane. The horizontal plane lies perpendicularly to a coupling direction 30a. The positioning mechanism 16a is configured for the purpose of positioning the wafer transportation container 10a in such a manner that a deviation from an ideal loading and/or unloading position is no more than 3 mm. The positioning device comprises a controller 18a. The controller 18a is configured for the purpose of controlling and/or regulating the positioning of the wafer transportation container 10a by means of the positioning mechanism 16a. The controller 18a is assigned to the loading and/or unloading station 14a. The controller 18a of the positioning mechanism 16a comprises a communication module 72a. The communication module 72a of the controller 18a of the positioning mechanism 16a is configured for the purpose of receiving control and/or regulating commands for controlling the positioning process of the wafer transportation container 10a. The communication module 72a of the controller 18a of the positioning mechanism 16a is configured for the purpose of emitting control and/or regulating commands of the controller 18a of the positioning mechanism 16a to a further controller, for example of a transport carriage 54a.

The positioning device comprises a final positioning mechanism 36a. The final positioning mechanism 36a is realized separately from the positioning mechanism 16a. The final positioning mechanism 36a is realized in a contacting manner. The loading and/or unloading system 38a comprises a guide unit 42a. The guide unit 42a is a main functional component of the final positioning mechanism 36a. The guide unit 42a comprises a guide element 44a. The guide element 44a is realized as a bolt-like projection. The guide element 44a is realized as a pin. The guide element 44a is realized tapering toward its end. The guide element 44a is arranged on the surface 40a of the loading and/or unloading station 14a. The guide unit 42a comprises a guide rail 46a. The guide rail 46a is realized as an indentation. The guide rail 46a is arranged on an outer surface of the wafer transportation container opening element 62a. The guide element 44a is configured for the purpose of engaging in the guide rail 46a during final positioning.

The guide rail 46a comprises an outer form which is complementary to the guide element 44a. By a surface of the guide element 44a sliding along a surface of the guide rail 46a, the final positioning mechanism 36a aligns the wafer transportation container 10a relative to the loading and/or unloading station 14a by means of the guide unit 42a.

The positioning mechanism 16a includes positioning elements 20a, 20'a, 22a, 22'a, 24a, 24'a. The positioning elements 20a, 20'a, 22a, 22'a, 24a, 24'a are respectively configured for generating a positioning force field. The positioning elements 20a, 20'a, 22a, 22'a, 24a, 24'a are configured for the purpose of generating a positioning force field which is realized as a magnetic field. As an alternative to this or in addition to it, the positioning elements 20a, 20'a, 22a, 22'a, 24a, 24'a can be configured for the purpose of generating a positioning force field which is realized as an electrical field, in particular an electrostatic field. Three positioning elements 20a, 22a, 24a are arranged on the loading and/or unloading station 14a. The three positioning elements 20a, 22a, 24a arranged on the loading and/or unloading station 14a are connected in a captive manner to the loading and/or unloading station 14a. The three positioning elements 20a, 22a, 24a arranged on the loading and/or unloading station 14a are actively controllable and/or regulatable. The three positioning elements 20a, 22a, 24a arranged on the loading and/or unloading station 14a are operatively connected to the controller 18a. The controller 18a is configured for the purpose of controlling and/or regulating the positioning force fields of the actively controllable and/or regulatable positioning elements 20a, 22a, 24a. The controller 18a is configured for the purpose of controlling and/or regulating a strength and/or a direction of the positioning force fields. Each positioning element 20a, 22a, 24a is individually actuatable. The positioning force fields of the positioning elements 20a, 22a, 24a are each separately actuatable and/or regulatable. The actuation of the positioning elements 20a, 22a, 24a is coordinatable with a control of the wafer transportation container transport system 50a via the communication module 72a of the controller 18a.

Three further positioning elements 20'a, 22'a, 24'a are realized as corresponding positioning elements 20'a, 22'a, 24'a. The further positioning elements 20'a, 22'a, 24'a are realized as passive positioning elements 20'a, 22'a, 24'a. The further positioning elements 20'a, 22'a, 24'a are realized as permanent magnets 26a. As an alternative to this or in addition to it, the further positioning elements 20'a, 22'a, 24'a are realized from a ferromagnetic material. The further positioning elements 20'a, 22'a, 24'a comprise a static positioning force field. The static positioning force fields of the further positioning elements 20'a, 22'a, 24'a are configured for the purpose of interacting with the actively regulatable and/or controllable positioning force fields of the positioning elements 20a, 22a, 24a. The further positioning elements 20'a, 22'a, 24'a are arranged on the wafer transportation container 10a. The further positioning elements 20'a, 22'a, 24'a are arranged on the wafer transportation container opening element 62a. The further positioning elements 20'a, 22'a, 24'a are realized integrally with the wafer transportation container 10a. The further positioning elements 20'a, 22'a, 24'a are realized integrally with the wafer transportation container opening element 62a. The positioning force fields of the further positioning elements 20'a, 22'a, 24'a are realized independently of a power supply. As an alternative to this or in addition to it, it is imaginable for active positioning elements 20a, 20'a, 22a, 22'a, 24a, 24'a to be assigned to the wafer transportation container 10a and/or that passive positioning elements 20a, 20'a, 22a, 22'a, 24a, 24'a are assigned to the loading and/or unloading station 14a.

The positioning device comprises a check unit 32a. The check unit 32a is configured for position check and/or position regulating of an actual position of the wafer transportation container 10a during the coupling process. The check unit 32a comprises a sensor unit 34a. The sensor unit 34a is realized integrally with the positioning mechanism 16a. The sensor unit 34a comprises a sensor element 48a. The sensor element 48a is realized integrally with the positioning element 20a, 20'a, 22a, 22'a, 24a, 24'a. As an alternative to this or in addition to it, the sensor unit 34a can comprise sensor elements 48a which are realized separately from the positioning elements 20a, 20'a, 22a, 22'a, 24a, 24'a. The sensor unit 34a transmits sensor data from sensor elements 48a to the controller 18a. The controller 18a is configured for the purpose of performing control and/or regulation of the positioning force fields of the positioning elements 20a, 20'a, 22a, 22'a, 24a, 24'a in dependence on data from the sensor unit 34a. The controller 18a is configured for the purpose of performing, by way of position data from the sensor unit 34a, a comparison between the actual position of the wafer transportation container 10a and a required position of the wafer transportation container 10a and of performing controlled and/or regulated positioning of the wafer transportation container 10a in the loading and/or unloading position.

FIG. 2 shows a flow diagram of a method for operating the positioning device and/or the loading and/or unloading system 38a. In at least one method step 76a a wafer transportation container 10a is delivered by means of the wafer transportation container transport system 50a to the junction of the rail system 56a which is associated with the loading and/or unloading station 14a. In at least one further method step 78a rough positioning of the wafer transportation container 10a relative to the surface 40a of the loading and/or unloading station 14a is performed by means of the rough positioning mechanism 60a. In this case, the wafer transportation container 10a, which is connected to the transport carriage 54a by means of the holder 58a, is lowered on the holding elements 52a suspended vertically along the coupling direction 30a until it has moved into proximity of the loading and/or unloading station 14a. In at least one further method step 80a the wafer transportation container 10a is positioned, in particular pre-positioned, following the rough positioning. At the same time, during the coupling process between the wafer transportation container 10a and the loading and/or unloading station 14a, the wafer transportation container 10a is positioned, in particular pre-positioned, by the positioning mechanism 16a in a contactless manner relative to the loading and/or unloading station 14a. In at least one further method step 82a the wafer transportation container 10a following the positioning, in particular the pre-positioning, is finally positioned by means of the final positioning mechanism 36a. At the same time, the guide rail 46a of the already pre-positioned wafer transportation container 10a is moved to engage with the guide element 44a of the loading and/or unloading station 14a. If after positioning by the positioning mechanism 16a, small deviations from an ideal loading and/or unloading position are still present, they are made good by the mutual engagement of the parts of the guide unit 42a. In at least one further method step 84a, the wafer transportation container 10a is opened and the wafers 12a transported therein are reloaded via the loading and/or unloading station 14a into the wafer process module. In at least one further method step 86a wafers 12a are loaded into the wafer transportation container 10a via the loading and/or unloading station 14a. The opened wafer transportation container 10a, docked on the loading and/or unloading station 14a, is re-closed in the method step 86a. In at least one further method step 88a the closed wafer transportation container 10a is raised by the wafer transportation container transport system 50a and removed from the loading and/or unloading station 14a. In at least one further method step 90a the wafer transportation container 10a is moved away from the junction of the rail system 56a associated with the loading and/or unloading station 14a by means of the wafer transportation container transport system 50a.

FIGS. 3 to 6 show three further exemplary embodiments of the invention. The following descriptions and the drawings are limited substantially to the differences between the exemplary embodiments, wherein with reference to identically designated components, in particular with reference to components with identical reference symbols, reference can also be made in principle to the drawings and/or the description of the other exemplary embodiments, in particular those of FIGS. 1 and 2. To differentiate between the exemplary embodiments, the letter a is placed after the reference symbols of the exemplary embodiment in FIGS. 1 and 2. The letter a is replaced by the letters b to d in the exemplary embodiments of FIGS. 3 to 6.

FIG. 3 shows a schematic representation of a loading and/or unloading system 38b with a wafer transportation container 10b, a loading and/or unloading station 14b and with a positioning device. In the representation shown in FIG. 3, the loading and/or unloading system 38b is situated in a non-coupled state. The wafer transportation container 10b is free of contact with the loading and/or unloading station 14b. The wafer transportation container 10b is situated in proximity to the loading and/or unloading station 14b. The positioning device comprises a positioning mechanism 16b. The positioning mechanism 16b includes positioning elements 20b, 22b, 24b, 92b. The positioning elements 20b, 22b, 24b, 92b are configured for the purpose of each generating a positioning force field. The positioning elements 20b, 22b, 24b, 92b are configured for the purpose of generating a positioning force field which is realized as a magnetic field. The positioning force fields are configured for the purpose of interacting with the wafer transportation container 10b. The wafer transportation container 10b comprises an outer shell 96b. The outer shell 96b is realized at least partly from a material which is repelled and/or attracted by an external magnetic field. The positioning force fields are configured for the purpose of interacting with a material of the outer shell 96b of the wafer transportation container 10b. As an alternative to this or in addition to it, the positioning elements 20b, 22b, 24b, 92b can be configured for the purpose of generating a positioning force field which is realized as an electrical field, in particular an electrostatic field.

The positioning device comprises a fastening unit 94b. The fastening unit 94b is configured for the bearing arrangement of the positioning elements 20b, 22b, 24b, 92b relative to the loading and/or unloading station 14b. The fastening unit 94b includes two double rails which connect the positioning elements 20b, 22b, 24b, 92b in a captive manner to the loading and/or unloading station 14b. The positioning elements 20b, 22b, 24b, 92b are supported so as to be movable, in particular slidable and pivotable, relative to a surface 40b of the loading and/or unloading station 14b. The positioning elements 20b, 22b, 24b, 92b are configured for the purpose, in the case of a movement of the wafer transportation container 10b in the coupling direction 30b, of following the movement of the wafer transportation container 10b at least in part. As a result, good stabilization can be achieved in an advantageous manner of a position set up by the positioning force fields in a coupling process between wafer transportation container 10b and loading and/or unloading station 14b. The positioning device shown in FIG. 3 comprises four positioning elements 20b, 22b, 24b, 92b which are each mounted in twos on a double rail.

Alternatively to this, the positioning device can comprise a number of positioning elements 20b, 22b, 24b, 92b which differs from four, a number of positioning elements 20b, 22b, 24b, 92b which differs from two per double rail and/or a number of double rails which differs from two. In addition, the positioning elements 20b, 22b, 24b, 92b can be supported in another manner so as to be movable and/or pivotable relative to the surface 40b of the loading and/or unloading station 14b, for example by means of a three-dimensionally pivotable and translationally slidable turntable, tilt table and/or swiveling table and/or by means of a displaceably supported ball joint (cf. also FIG. 4).

FIG. 4 shows a schematic representation of a positioning element 20b, 22b, 24b, 92b which is pivotable and translatable in many directions. The positioning element 20b, 22b, 24b, 92b shown is translatable, as an example, along three translational axes 98b in the x, y and z direction. The positioning element 20b, 22b, 24b, 92b shown is pivotable, as an example, around four pivot axes 100b which are aligned horizontally, vertically and at angles of ±45° inclined to the horizontal. Further pivot and/or translational axes are conceivable as an alternative to this. In an advantageous manner, precision of contactless positioning can be increased the greater the number of possible, in particular actuatable, pivot and/or translation positions for the positioning element 20b, 22b, 24b, 92b.

FIG. 5 shows a schematic representation of a further alternative positioning element 20c, 22c, 24c, 92c of a further alternative positioning device. The positioning element 20c, 22c, 24c, 92c is configured for the purpose of generating a positioning force field which is realized as a flow field of a flowing gas. The positioning element 20c, 22c, 24c, 92c comprises a nozzle 28c. The nozzle 28c is configured for generating a partially directed gas flow. The partially directed gas flow emerges from the nozzle 28c during active positioning. The gas flow of the nozzle 28c of the positioning element 20c, 22c, 24c, 92c is aligned substantially perpendicularly to a coupling direction 30c of the positioning device. When the partially directed gas flow emerges from the nozzle 28c, the nozzle 28c is situated in a blowing mode. In blowing mode, the nozzle 28c is configured for pushing away an object, in particular a wafer transportation container 10c, from the positioning element 20c, 22c, 24c, 92c. As an alternative to this or in addition to it, a nozzle 28c can be configured for a sucking mode. In the case of a sucking mode, the gas flow is directed substantially onto the nozzle 28c. The positioning element 20c, 22c, 24c, 92c comprises five separate nozzles 28c. The nozzles 28c can be connected to a common pump system for generating the gas flow and/or can comprise separate pump systems for at least two of the nozzles 28c. As an alternative to this, the positioning element 20c, 22c, 24c, 92c can comprise a number of nozzles 28c which differs from five.

FIG. 6 shows a schematic representation of a top view of an additional alternative loading and/or unloading station 14d of a loading and/or unloading system 38d. The loading and/or unloading system 38d comprises a positioning device. The positioning device comprises a positioning mechanism 16d. The positioning mechanism 16d comprises a nozzle 28d. The nozzle 28d is configured for generating a partially directed gas flow. The gas flow is aligned substantially parallel to a coupling direction 30d of the positioning device. The coupling direction 30d is perpendicular to the drawing plane in FIG. 6. The nozzle 28d is realized in a ring-shaped manner. The nozzle 28d realizes a closed annular form. As an alternative to this, the nozzle 28d can comprise a closed form which deviates from an annular form or a partially interrupted form which can be realized in a ring-shaped manner and/or deviate from an annular form. The nozzle 28d is arranged in a ring-shaped manner around a region of the loading and/or unloading station 14d which is configured for receiving a wafer transportation container 10*d*. The nozzle 28*d* is arranged in a ring-shaped manner around a region of the loading and/or unloading station 14*d* which is configured to be lowered into an interior space of the loading and/or unloading station 14*d* for an opening of the wafer transportation container 10*d*. The nozzle 28*d* is arranged in a ring-shaped manner around an opening element 102*d* of the loading and/or unloading station 14*d*. The nozzle 28*d* is configured for the purpose of realizing an air curtain around the opening element 102*d* of the loading and/or unloading station 14*d* in an active operation. The nozzle 28*d* is configured for the purpose of realizing, in an active operation, an air curtain around the region of the loading and/or unloading station 14*d* which is configured for the purpose of receiving the wafer transportation container 10*d*. The nozzle 28*d* is configured for the purpose of realizing, in an active operation, an air curtain around the region of the loading and/or unloading station 14*d* which is lowered into the interior of the loading and/or unloading station 14*d* for the opening of the wafer transportation container 10*d*.

LIST OF REFERENCES

10 Wafer transportation container
12 Wafer
14 Loading and/or unloading station
16 Positioning mechanism
18 Controller
20 Positioning element
22 Positioning element
24 Positioning element
26 Permanent magnet
28 Nozzle
30 Coupling direction
32 Check unit
34 Sensor unit
36 Final positioning mechanism
38 Loading and/or unloading system
40 Surface
42 Guide unit
44 Guide element
46 Guide rail
48 Sensor element
50 Wafer transportation container transport system
52 Holding element
54 Transport carriage
56 Rail system
58 Holder
60 Rough positioning mechanism
62 Wafer transportation container opening element
64 Base body
66 Loading and/or unloading direction
68 Controller
70 Base body
72 Communication module
74 Communication module
76 Method step
78 Method step
80 Method step
82 Method step
84 Method step
86 Method step
88 Method step
90 Method step
92 Positioning element
94 Fastening unit
96 Outer shell
98 Translational axis
100 Pivot axis
102 Opening element

The invention claimed is:

1. A loading and/or unloading system for loading and/or unloading wafers from a wafer transportation container with a positioning device for positioning the wafer transportation container in a loading and/or unloading position of a loading and/or unloading station by contactlessly controlling an at least two-dimensional movement of the wafer transportation container in such a manner that the wafer transportation container assumes a spatial alignment in a plane which lies at least substantially perpendicular to a main direction of movement, along which the wafer transportation container moves during a coupling process, when approaching the loading and/or unloading position, in which the wafer transportation container is connectable to the loading and/or unloading station in a vacuum-tight manner, the positioning device comprising:
the loading and/or unloading station, configured at least for loading and/or unloading wafers from the wafer transportation container,
the wafer transportation container,
a final positioning mechanism, which is realized in a contacting manner comprising a guide rail of a guide unit with at least one guide projection slidably engageable in the guide rail,
a clean room-suitable pre-positioning mechanism which is configured for a contactless pre-positioning of the wafer transportation container in a coupling process of the wafer transportation container and the loading and/or unloading station, with the clean room-suitable contactless pre-positioning mechanism being independent of any wafer transportation container transport which is configured for logistics of wafer transportation containers, and
a controller, including a processor and a storage with a control and/or regulation program stored therein which is executed by the processor, wherein said controller is configured to control and/or regulate the pre-positioning mechanism to contactlessly pre-position the wafer transportation container in the coupling process of the wafer transportation container and the loading and/or unloading station,
the clean room-suitable contactless pre-positioning mechanism being realized separately from the final positioning mechanism,
the clean room-suitable pre-positioning mechanism comprising:
at least one positioning element, which is realized as a permanent magnet, which is arranged on the wafer transportation container and which is configured for the purpose of generating at least one positioning force field, and
at least one further positioning element, which includes at least one magnetic coil, which is configured for the purpose of generating at least one contactlessly transmissible positioning force field and which, for a purpose of interacting with a static magnetic field of the at least one positioning element, is configured for a generating of a controllable and/or regulatable magnetic field by means of the magnetic coil,
wherein the clean room-suitable contactless pre-positioning mechanism is arranged in a proximity to the loading and/or unloading station and is configured for a proximity positioning of the wafer transportation container in the loading and/or unloading position, and wherein the clean room-suitable contactless pre-positioning mechanism is configured for the purpose of generating a force which acts in proximity to the loading and/or unloading station and which develops its greatest effect in a proximity to the loading and/or unloading station.

2. The loading and/or unloading system according to claim 1, wherein the pre-positioning mechanism is configured for the purpose of pre-positioning the wafer transportation container in such a manner that a deviation from an ideal loading and/or unloading position is no more than 3 mm, wherein the ideal loading and/or unloading position is realized as a position of the wafer transportation container in which a contact region of the wafer transportation container and a contact region of an opening element of the loading and/or unloading station overlap in such a manner that a maximum gas tightness of a connection between wafer transportation container and loading and/or unloading station is achieved.

3. The loading and/or unloading system according to claim 1, wherein the pre-positioning mechanism is configured for the purpose of generating at least one repulsion force for the pre-positioning.

4. The loading and/or unloading system according to claim 1, wherein the at least one positioning element is realized at least partly integrally with the wafer transportation container.

5. The loading and/or unloading system according to claim 1, wherein the at least one further positioning element is connected in a captive manner to the loading and/or unloading station.

6. The loading and/or unloading system according to claim 5, wherein the at least one further positioning element is supported so as to be movable relative to the loading and/or unloading station.

7. A method for an operation of the loading and/or unloading system for loading and/or unloading wafers from the wafer transportation container with the positioning device according to claim 1, wherein in the coupling process, the wafer transportation container is pre-positioned contactlessly relative to the loading and/or unloading station by contactlessly controlling the at least two-dimensional movement of the wafer transportation container so that the wafer transportation container assumes the spatial alignment when approaching the loading and/or unloading position, wherein the contactless pre-positioning is independent of any wafer transportation container transport which is configured for logistics of wafer transportation containers.

8. The method according to claim 7, wherein the wafer transportation container is pre-positioned directly following external rough positioning.

* * * * *